US011955955B2

(12) United States Patent
Tsai

(10) Patent No.: US 11,955,955 B2
(45) Date of Patent: Apr. 9, 2024

(54) HEMT-BASED DRIVER CIRCUIT AND METHOD OF OPERATING THE SAME

(71) Applicant: TAIWAN SEMICONDUCTOR MANUFACTURING COMPANY, LTD., Hsinchu (TW)

(72) Inventor: Ming Hsien Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/312,230

(22) Filed: May 4, 2023

(65) Prior Publication Data

US 2023/0275575 A1  Aug. 31, 2023

Related U.S. Application Data

(63) Continuation of application No. 17/396,515, filed on Aug. 6, 2021, now Pat. No. 11,677,393, which is a
(Continued)

(51) Int. Cl.
*H02M 1/00* (2006.01)
*H02M 1/08* (2006.01)
(Continued)

(52) U.S. Cl.
CPC ........ *H03K 17/08122* (2013.01); *H02M 1/08* (2013.01); *H02M 1/32* (2013.01)

(58) Field of Classification Search
CPC .................................. H02M 1/08; H02M 1/32
See application file for complete search history.

(56) References Cited

U.S. PATENT DOCUMENTS

| 10,504,769 B2 | 12/2019 | Høyerby et al. |
| 10,601,302 B1 | 3/2020 | Sharma et al. |

(Continued)

FOREIGN PATENT DOCUMENTS

| JP | 2004128162 | 4/2004 |
| JP | 2011082967 | 4/2011 |

(Continued)

OTHER PUBLICATIONS

Fuhua, Li, et al., "Design of a Under Voltage Lock Out Circuit with Bandgap Structure," ISIC 2009, pp. 224-227.
(Continued)

*Primary Examiner* — Sisay G Tiku
(74) *Attorney, Agent, or Firm* — Hauptman Ham, LLP

(57) ABSTRACT

A circuit includes power supply and reference nodes, a protection circuit including a first output terminal and first and second series of n-type HEMTs coupled between the power supply and reference nodes, and a gate driver including a second output terminal and third through fifth series of n-type HEMTs coupled between the power supply and reference nodes. The first HEMT series controls a first node voltage responsive to a power supply node voltage, the second HEMT series controls a first output terminal voltage responsive to the first node voltage, the third HEMT series controls an internal signal on a second node responsive to the first output terminal voltage and to an input signal, the fourth HEMT series controls a third node voltage responsive to the internal signal, and the fifth HEMT series controls a signal at the second output terminal responsive to the internal signal and the third node voltage.

20 Claims, 8 Drawing Sheets

Related U.S. Application Data continuation of application No. 16/450,544, filed on Jun. 24, 2019, now Pat. No. 10,904,105.

(60) Provisional application No. 62/712,961, filed on Jul. 31, 2018.

(51) Int. Cl.
*H02M 1/32* (2007.01)
*H03K 17/0812* (2006.01)

(56) References Cited

U.S. PATENT DOCUMENTS

| | | |
|---|---|---|
| 2011/0057190 A1 | 3/2011 | Kimura et al. |
| 2012/0139589 A1 | 6/2012 | Machida et al. |
| 2014/0146429 A1 | 5/2014 | Lee et al. |
| 2015/0091539 A1 | 4/2015 | Norling |
| 2016/0372920 A1 | 12/2016 | Kinzer et al. |
| 2017/0170821 A1* | 6/2017 | Marini ............. H03K 17/08122 |
| 2017/0264286 A1 | 9/2017 | Goto |
| 2017/0346274 A1 | 11/2017 | Nakahara et al. |
| 2017/0359060 A1* | 12/2017 | Godycki ............... H02M 3/158 |
| 2019/0252964 A1 | 8/2019 | Chao et al. |
| 2019/0356211 A1 | 11/2019 | Chao et al. |
| 2020/0044643 A1 | 2/2020 | Tsai |
| 2020/0076411 A1 | 3/2020 | Lee et al. |
| 2020/0083795 A1 | 3/2020 | Chao et al. |
| 2020/0099367 A1 | 3/2020 | Bodano et al. |
| 2020/0228116 A1* | 7/2020 | Chern ................. H03K 17/063 |
| 2020/0304119 A1 | 9/2020 | Chern et al. |
| 2020/0321960 A1 | 10/2020 | Chao et al. |
| 2021/0281259 A1 | 9/2021 | Chern et al. |

FOREIGN PATENT DOCUMENTS

| | | |
|---|---|---|
| KR | 20170092605 | 8/2017 |
| TW | 201232512 | 8/2012 |
| TW | 201419939 | 5/2014 |
| TW | 201607244 | 2/2016 |

OTHER PUBLICATIONS

Cho, Min-Hyeong et al., "Development of Undervoltage Lockout (UVLO) Circuit Configurated Schmitt Trigger," ISOCC 2015, pp. 1-2.

Office Action dated Jun. 5, 2020 from corresponding application No. TW 108125652.

Office Action dated Jun. 2, 2020 from corresponding application No. KR 10-2019-0091307.

* cited by examiner

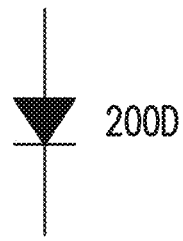
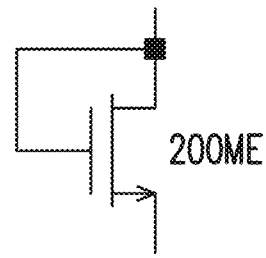
FIG. 2B          FIG. 2C
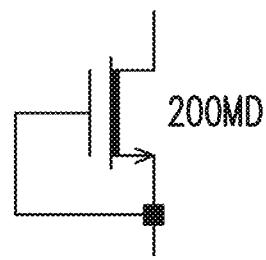
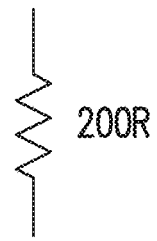
FIG. 2D          FIG. 2E

HEMT-BASED DRIVER CIRCUIT AND METHOD OF OPERATING THE SAME

PRIORITY CLAIM

The present application is a continuation of U.S. application Ser. No. 17/396,515, filed Aug. 6, 2021, which is a continuation of U.S. application Ser. No. 16/450,544, filed Jul. 2, 2019, now U.S. Pat. No. 11,201,613, issued Dec. 14, 2021, which claims the priority of U.S. Provisional Application No. 62/712,961, filed Jul. 31, 2018, each of which is incorporated herein by reference in its entirety.

BACKGROUND

In high voltage applications, integrated circuits (ICs) sometimes include field-effect transistors (FETs) based on a wide-bandgap (WBG) semiconductor, e.g., gallium nitride (GaN), as switching devices to take advantage of high switching speeds, low on-resistance, and tolerance for high temperature operation. Typically, silicon (Si) based gate drivers are used to drive the gates of the switching devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2E are diagrams of voltage divider configurations, in accordance with some embodiments.

DETAILED DESCRIPTION

Figure 1:
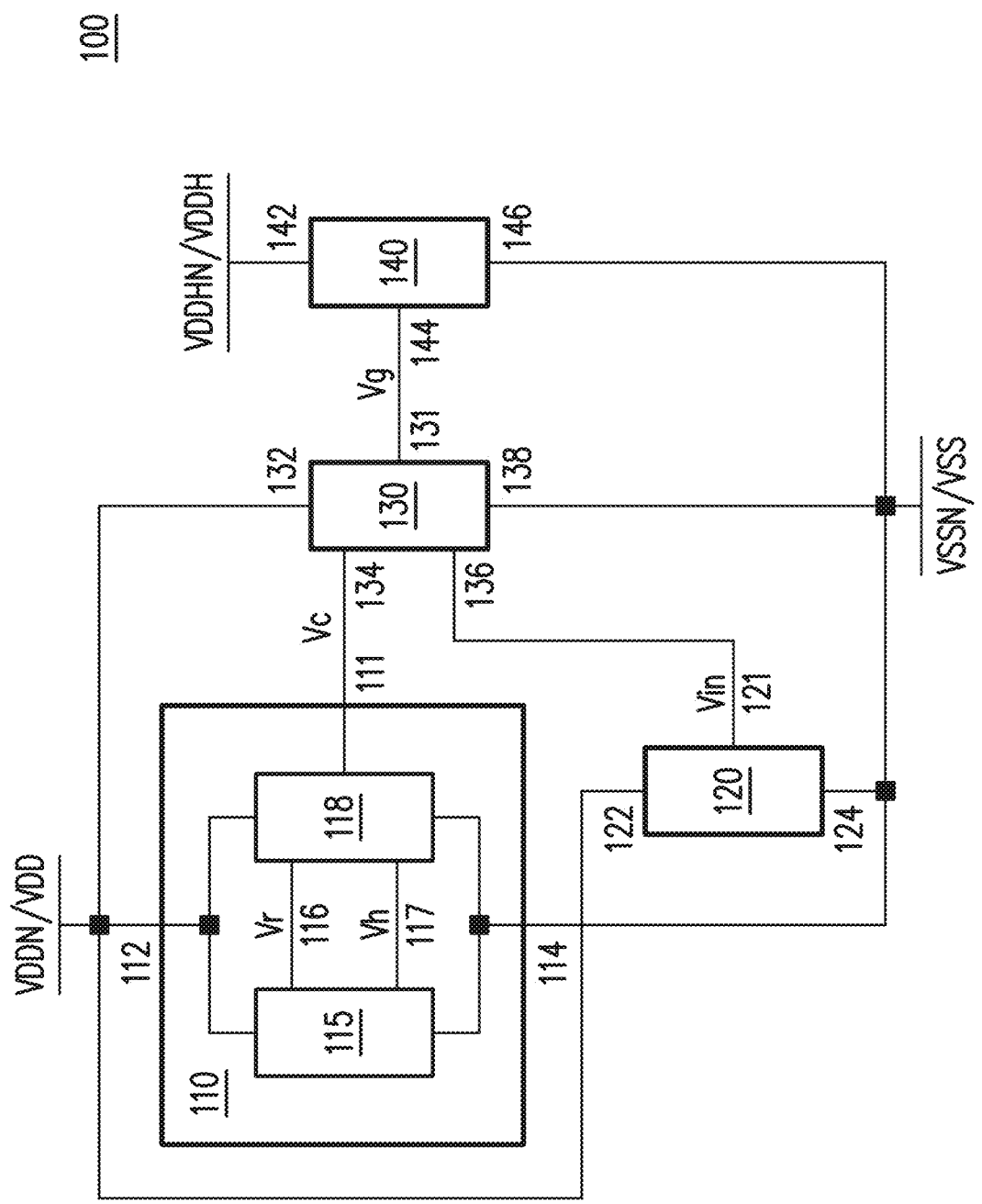
FIG. 1 is a diagram of a driver circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a driver circuit is based on n-type high electron mobility transistors (HEMTs) and configured to use a power source to drive a high voltage (HV) device during normal switching operations. The various embodiments are therefore capable of being manufactured using NMOS-based processes in which Si-based devices are integrated with HV devices without requiring additional masks for p-type devices.

To protect against under-voltage conditions of the power source that could lead to uncontrolled HV switching and potentially damaging or dangerous scenarios, the driver circuit is also configured to detect an under-voltage condition and respond by outputting a signal to disable switching of the HV device in a lockout mode. Under-voltage lockout (UVLO) protection is thereby provided to a circuit that includes the HV device by using a driver circuit capable of being manufactured more efficiently than circuits in which UVLO protection is not based on n-type HEMTs.

FIG. 1 is a diagram of a driver circuit 100, in accordance with some embodiments. In some embodiments, driver circuit 100 is a component of a larger circuit, e.g., a direct current (DC) to DC voltage converter.

In the embodiment depicted in FIG. 1, driver circuit 100 includes a protection circuit 110, a signal generator 120, a gate driver 130, and an HV circuit 140. Each of protection circuit 110, signal generator 120, and gate driver 130 is coupled between a power supply node VDDN and a power supply reference node VSSN, and HV circuit 140 is coupled between a power supply node VDDHN and power supply reference node VSSN.

Protection circuit 110 includes an input terminal 112 coupled to power supply node VDDN, an input terminal 114 coupled to power supply reference node VSSN, and an output terminal 111 coupled to an input terminal 134 of gate driver 130; signal generator 120 includes an input terminal 122 coupled to power supply node VDDN, an input terminal 124 coupled to power supply reference node VSSN, and an output terminal 121 coupled to input terminal 136 of gate driver 130; in addition to input terminals 134 and 136, gate driver 130 includes an input terminal 132 coupled to power supply node VDDN, an input terminal 138 coupled to power supply reference node VSSN, and an output terminal 131 coupled to an input terminal 144 of HV circuit 140; in addition to input terminal 144, HV circuit 140 includes an input terminal 142 coupled to power supply node VDDHN and an input terminal 146 coupled to power supply reference node VSSN.

Two or more circuit elements are considered to be coupled based on a direct electrical connection or an electrical connection that includes one or more additional circuit elements and is thereby capable of being controlled, e.g., made resistive or open by a transistor or other switching device.

Power supply reference node VSSN is a circuit node configured to carry a power supply reference voltage having a power supply reference voltage level VSS. In some embodiments, power supply reference voltage level VSS is a ground voltage level.

Power supply node VDDN is a circuit node configured to carry a power supply voltage having a power supply voltage level VDD relative to power supply reference voltage level VSS. In some embodiments, power supply voltage level VDD is a power supply voltage level of an IC chip that includes driver circuit 100. In some embodiments, power supply voltage level VDD is a power supply voltage level of a logic portion of an IC chip that includes driver circuit 100.

The power supply voltage carried on power supply node VDDN is received from a power source (not shown) external to driver circuit 100, and power supply voltage level VDD is controlled by the power source. In some embodiments, the power supply voltage carried on power supply node VDDN is received from a battery, and power supply voltage level VDD is based on the output voltage level of the battery.

In some embodiments, power supply node VDDN is configured to carry the power supply voltage having power supply voltage level VDD ranging from 1 volt (V) to 25 V. In some embodiments, power supply node VDDN is configured to carry the power supply voltage having power supply voltage level VDD ranging from 10 V to 15 V.

Power supply node VDDHN is a circuit node configured to carry a power supply voltage having a power supply voltage level VDDH relative to power supply reference voltage level VSS. In some embodiments, power supply voltage level VDDH is a power supply voltage level of a high-voltage portion of an IC chip that includes driver circuit 100. The power supply voltage carried on power supply node VDDHN is received from a power source (not shown) external to driver circuit 100, and power supply voltage level VDDH is controlled by the power source.

In some embodiments, power supply node VDDHN is configured to carry the power supply voltage having power supply voltage level VDDH ranging from 25 V to 900 V. In various embodiments, power supply node VDDHN is configured to carry the power supply voltage having power supply voltage level VDDH ranging from 50 V to 150 V or from 600 V to 700 V.

Protection circuit 110 is an electronic circuit configured to output a signal Vc at output terminal 111 responsive to power supply voltage level VDD received at input terminal 112 and power supply reference voltage level VSS received at input terminal 114. Signal generator 120 is an electronic circuit configured to output a signal Vin at output terminal 121 responsive to power supply voltage level VDD received at input terminal 122, power supply reference voltage level VSS received at input terminal 124, and, in some embodiments, to one or more signals received at one or more additional input terminals (not shown). Gate driver 130 is an electronic circuit configured to receive power supply voltage level VDD at input terminal 132 and power supply reference voltage level VSS at input terminal 138, and to output a signal Vg at output terminal 131 responsive to signal Vc received at input terminal 134 and signal Vin received at input terminal 136. HV circuit 140 is an electronic circuit configured to receive power supply voltage level VDDH at input terminal 142 and power supply reference voltage level VSS at input terminal 146, and to execute one or more switching functions responsive to signal Vg received at input terminal 144.

Signals Vc, Vin, and Vg have voltage levels within a range from power supply reference voltage level VSS to power supply voltage level VDD. A logically low voltage level corresponds to a portion of the range from power supply reference voltage level VSS up to a first predetermined voltage level, and a logically high voltage level corresponds to a portion of the range from power supply voltage level VDD down to a second predetermined voltage level greater than or equal to the first predetermined voltage level.

Each of protection circuit 110 and gate driver 130 includes n-type depletion-mode and/or enhancement mode HEMTs, e.g., GaN-based transistors, and are configured as discussed below so as to respond to an under-voltage status of power supply voltage level VDD by generating signal Vg having one of the logically low or logically high voltage levels, thereby disabling the switching functions of HV circuit 140.

Protection circuit 110 includes a voltage divider 115 coupled between input terminals 112 and 114 and a detection circuit 118 coupled between input terminals 112 and 114, detection circuit 118 thereby being arranged in parallel with voltage divider 115. In the embodiment depicted in FIG. 1, protection circuit 110 includes a signal path 116 connecting voltage divider 115 and detection circuit 118 to each other, and a signal path 117 connecting voltage divider 115 and detection circuit 118 to each other. In some embodiments, protection circuit 110 does not include signal path 117.

Voltage divider 115 is configured to generate a voltage Vr on signal path 116 responsive to power supply voltage level VDD, power supply reference voltage level VSS, and a voltage Vh received from detection circuit 118 on signal path 117. Detection circuit 118 is configured to receive voltage Vr on signal path 116 and generate signal Vc at output terminal 111 responsive to voltage Vr and, in some embodiments, voltage Vh on signal path 117 responsive to voltage Vr. In some embodiments, voltage divider 115 is configured to generate voltage Vr without receiving voltage Vh from detection circuit 118 on signal path 117. In various embodiments, voltage divider 115 includes voltage divider 200 discussed below with respect to FIGS. 2A-2E and/or detection circuit 118 includes detection circuit 300 discussed below with respect to FIG. 3.

Voltage divider 115 includes a plurality of circuit components (not shown in FIG. 1) connected in series between input terminals 112 and 114, and between two of the series components, a voltage tap (not shown in FIG. 1) coupled to signal path 116, at which voltage Vr is generated. Voltage divider 115 is thereby configured to generate voltage Vr having a voltage level between power supply voltage level VDD and power supply reference voltage level VSS.

In various embodiments, the series components include one or a combination of resistors, diode devices, or other circuit components suitable for generating voltage drops responsive to power supply voltage level VDD and power supply reference voltage level VSS. In various embodiments, a diode device includes a two-terminal p-n junction, an n-type transistor configured as a diode, or another suitable IC device. In various embodiments, an n-type transistor configured as a diode is a depletion-mode HEMT, e.g., a GaN-based transistor, including a source terminal and a gate coupled together, or an enhancement-mode HEMT including a drain terminal and a gate coupled together.

In some embodiments, voltage divider 115 includes at least one n-type transistor (not shown in FIG. 1) arranged in parallel with at least one of the series components between the voltage tap and input terminal 114. The at least one n-type transistor includes a gate coupled to signal path 117, the at least one n-type transistor thereby being configured to receive voltage Vh and provide a low resistance path responsive to voltage Vh such that, in operation, the at least one series component is bypassed in response to voltage Vh. In various embodiments, the at least one n-type transistor, e.g., a GaN-based transistor, is a depletion-mode HEMT configured to provide the low resistance path in response to voltage Vh having the logically low voltage level or an enhancement-mode HEMT configured to provide the low resistance path in response to voltage Vh having the logically high voltage level.

In operation, bypassing the at least one series component causes a voltage drop across the at least one series component to decrease such that the voltage level of voltage Vr is decreased. In such embodiments, voltage divider 115 is thereby configured to alter the voltage level of voltage Vr responsive to the voltage level of voltage Vh such that voltage Vr includes information usable by detection circuit 118 in a hysteresis operation, as discussed below.

In operation, based on the one or more configurations of the series components discussed above, voltage Vr is generated having one or more voltage levels corresponding to one or more fractional values of power supply voltage level VDD, and voltage Vr thereby includes information usable by detection circuit 118 to detect power supply voltage level VDD having an under-voltage status.

Detection circuit 118 includes first and second n-type transistors (not shown in FIG. 1), e.g., depletion-mode and/or enhancement-mode HEMTs. The first n-type transistor has a gate coupled to signal path 116, and is thereby configured to control a logical voltage level of an internal node (not shown in FIG. 1) responsive to voltage Vr. The second n-type transistor has a gate configured to be responsive to the logical voltage level of the internal node, and a source or drain terminal coupled to output terminal 111, and is thereby configured to generate signal Vc responsive to voltage Vr.

The first and second n-type transistors are thereby configured to generate signal Vc having one of the logically low or logically high voltage levels in response to voltage Vr having a voltage level at or above a predetermined threshold voltage level, and a second one of the logically low or logically high voltage levels in response to voltage Vr having a voltage level below the threshold voltage level.

In various embodiments, the internal node is coupled to signal path 117, and detection circuit 118 is thereby configured so that in operation, the logical voltage level of the internal node is output to signal path 117 as voltage Vh. In such embodiments, detection circuit 118 is thereby configured to alter the voltage level of voltage Vh responsive to the voltage level of voltage Vr such that voltage Vh includes information usable by voltage divider 115 in a hysteresis operation, as discussed below.

By the configuration discussed above, protection circuit 110 includes voltage divider 115 configured to provide voltage Vr on signal path 116 responsive to power supply voltage level VDD, and detection circuit 118 configured to generate signal Vc at output terminal 111 having a logical voltage level based on the voltage level of voltage Vr, and thereby based on power supply voltage level VDD.

In operation, protection circuit 110 including voltage divider 115 and detection circuit 118 is thereby configured to detect power supply voltage level VDD and output signal Vc having one of the logically high or low voltage levels in response to power supply voltage level VDD being at or above a predetermined threshold voltage level and having the other of the logically high or low voltage levels in response to power supply voltage level VDD being below the threshold voltage level.

In embodiments in which protection circuit 110 includes signal path 117 and each of voltage divider 115 and detection circuit 118 is configured to include a hysteresis feature based on voltage Vh, protection circuit 110 is thereby configured to generate signal Vc at output terminal 111 having a logical voltage level based on multiple voltage levels of voltage Vr corresponding to multiple values of power supply voltage level VDD.

In various embodiments, in a hysteresis operation, detection circuit 118 is configured to respond to voltage Vr having the voltage level below the threshold voltage level by generating voltage Vh on signal path 117 having one of the logically high or low voltage levels, and voltage divider 115 is configured to respond to the logically high or low voltage level of voltage Vh by bypassing the at least one series component, thereby decreasing voltage Vr to a voltage level further below the threshold voltage level. The decrease in voltage Vr has a predetermined hysteresis value based on the configuration of voltage divider 115.

In the hysteresis operation, a first voltage level of voltage Vr below the threshold voltage level causes detection circuit 118 to generate first transitions in each of signal Vc and voltage Vh from a first logical voltage level to a second logical voltage level. To cause detection circuit 118 to generate second transitions in signal Vc and voltage Vh, a second voltage level of voltage Vr subsequent to the first voltage level must be greater than the first level by at least an amount equal to the predetermined hysteresis value. The hysteresis operation thereby prevents increases in subsequent voltage levels of voltage Vr below the predetermined hysteresis value from causing detection circuit 118 to generate second transitions in signal Vc and voltage Vh.

Signal generator 120 incudes a plurality of circuit components (not shown) configured to generate signal Vin responsive to power supply voltage level VDD, power supply reference voltage level VSS, and one or more signals (not shown), in some embodiments. In some embodiments, the circuit components include n-type transistors, e.g., depletion-mode and/or enhancement-mode HEMTs.

Signal generator 120 is configured to generate signal Vin having voltage levels that vary between the logically high and low voltage levels. In various embodiments, signal generator 120 includes circuit components corresponding to a portion of, one of, or a combination of a pulse width modulation (PWM) circuit, a logic circuit, a controller, or another circuit suitable for generating signal Vin having the logically high and low voltage levels. Additional details of the circuit components and various configurations of signal generator 120 are not depicted or further discussed for the purpose of clarity.

In some embodiments, driver circuit 100 does not include signal generator 120, and driver circuit 100 is otherwise coupled to a signal generator, e.g., signal generator 120, external to driver circuit 100, and is thereby configured to receive signal Vin at input terminal 136 of gate driver 130.

Gate driver 130 includes first and second n-type transistors (not shown in FIG. 1), e.g., depletion-mode and/or enhancement-mode HEMTs. The first n-type transistor has a gate coupled to input terminal 134, and is thereby configured to partially control a voltage level of an internal node (not shown in FIG. 1) responsive to signal Vc. The second n-type transistor has a gate coupled to input terminal 136, and is thereby configured to partially control the voltage level of the internal node responsive to signal Vin.

Gate driver 130 also includes a direct-coupled FET logic (DCFL) circuit (not shown in FIG. 1) coupled between the internal node and output terminal 131, and is thereby configured to generate signal Vg at output terminal 131 responsive to the voltage level of the internal node. The DCFL circuit includes a plurality of n-type transistors (not shown in FIG. 1), e.g., depletion-mode and/or enhancement-mode HEMTs, and a bootstrap circuit.

The bootstrap circuit includes a diode device and a capacitive device coupled in series between power supply node VDDN and output terminal 131, thereby enabling one or more voltage levels internal to the DCFL circuit to exceed power supply voltage level VDD such that, in operation, an n-type transistor is usable to generate signal Vg having the logically high voltage level.

In various embodiments, a capacitive device includes a two-terminal capacitor, a transistor, e.g., a HEMT, configured as a capacitor, or another suitable IC device. In some embodiments, gate driver 130 includes gate driver 400 discussed below with respect to FIG. 4.

In operation, by the configuration discussed above, gate driver 130 responds to signal Vc having the logically high or low voltage level corresponding to power supply voltage level VDD being at or above the threshold voltage level by generating signal Vg having logical voltage levels that track logical voltage levels of signal Vin. Gate driver 130 responds to signal Vc having the logically high or low voltage level corresponding to power supply voltage level VDD being below the threshold voltage level by generating signal Vg within one of the voltage level ranges corresponding to the logically high or low voltage levels.

In various embodiments, signal Vg being within one of the voltage ranges includes signal Vg having a single voltage level independent of the logical voltage levels of signal Vin or having a first voltage level corresponding to the logically high voltage level of signal Vin and a second voltage level corresponding to the logically low voltage level of signal Vin.

HV circuit 140 includes at least one depletion-mode or enhancement-mode n-type HEMT (not shown in FIG. 1), e.g., a GaN-based transistor, having a gate coupled to input terminal 144, the at least one n-type HEMT thereby being configured as at least one switching device capable of executing a switching operation responsive to signal Vg. The at least one n-type HEMT is configured to control at least one corresponding electrical connection between power supply node VDDHN and power supply reference node VSSN such that the switching operation controls coupling at one or more locations within HV circuit 140.

In some embodiments, the at least one n-type HEMT includes a depletion-mode HEMT and the switching operation includes switching off the depletion-mode HEMT in response to signal Vg transitioning from having the logically low voltage level to having the logically high voltage level and/or switching on the depletion-mode HEMT in response to signal Vg transitioning from having the logically high voltage level to having the logically low voltage level.

In some embodiments, the at least one n-type HEMT includes an enhancement-mode HEMT and the switching operation includes switching on the enhancement-mode HEMT in response to signal Vg transitioning from having the logically low voltage level to having the logically high voltage level and/or switching off the enhancement-mode HEMT in response to signal Vg transitioning from having the logically high voltage level to having the logically low voltage level.

In some embodiments, HV circuit 140 is HV circuit 500 discussed below with respect to FIG. 5. In some embodiments, driver circuit 100 does not include HV circuit 140, and driver circuit 100 is otherwise coupled to an HV circuit, e.g., HV circuit 140, external to driver circuit 100, and is thereby configured to output signal Vg to the HV circuit.

As discussed above, driver circuit 100 includes protection circuit 110 configured to generate signal Vc having logical voltage levels based on values of power supply voltage level VDD relative to a threshold voltage level, and gate driver 130 configured to generate signal Vg responsive to signal Vc. In response to signal Vc having the logical voltage level corresponding to power supply voltage level VDD equal to or greater than the threshold voltage level, gate driver 130 is configured to generate signal Vg having logical voltage levels that track those of signal Vin, thereby causing one or more n-type HEMTs in an HV circuit, e.g., HV circuit 140, to perform switching operations responsive to signal Vin in an operational mode. In response to signal Vc having the logical voltage level corresponding to power supply voltage level VDD less than the threshold voltage level, gate driver 130 is configured to generate signal Vg having the logical voltage level configured to cause the one or more n-type HEMTs to be switched off, thereby preventing performance of the switching operations in a lockout mode.

Driver circuit 100 is thereby configured to drive HV circuit 140 with signal Vg while providing UVLO protection based on power supply voltage level VDD by using n-type HEMTs. The various embodiments are therefore capable of being manufactured using NMOS-based processes in which Si-based devices are integrated with HV devices without requiring additional masks for p-type devices. Circuits that include driver circuit 100 thereby provide protection against uncontrolled HV device switching and potential damage combined with being manufactured more efficiently than circuits in which UVLO protection is not based on n-type HEMTs. Compared to approaches in which separate drivers and HV devices are combined on printed circuit boards (PCBs), circuits including n-type HEMT-based drivers integrated with HV devices also avoid the parasitic inductance added by PCB connections, thereby reducing operating losses in alternating current (AC) applications, especially at high frequencies, e.g., those above 1 megahertz (MHz).

In embodiments in which protection circuit 110 is configured to include the hysteresis feature discussed above, driver circuit 100 is further capable of providing UVLO protection in which small fluctuations in power supply voltage level VDD are prevented from causing a transition out of a lockout mode, thereby improving operational stability in some applications compared to approaches that do not include a hysteresis feature.

Figure 2A:
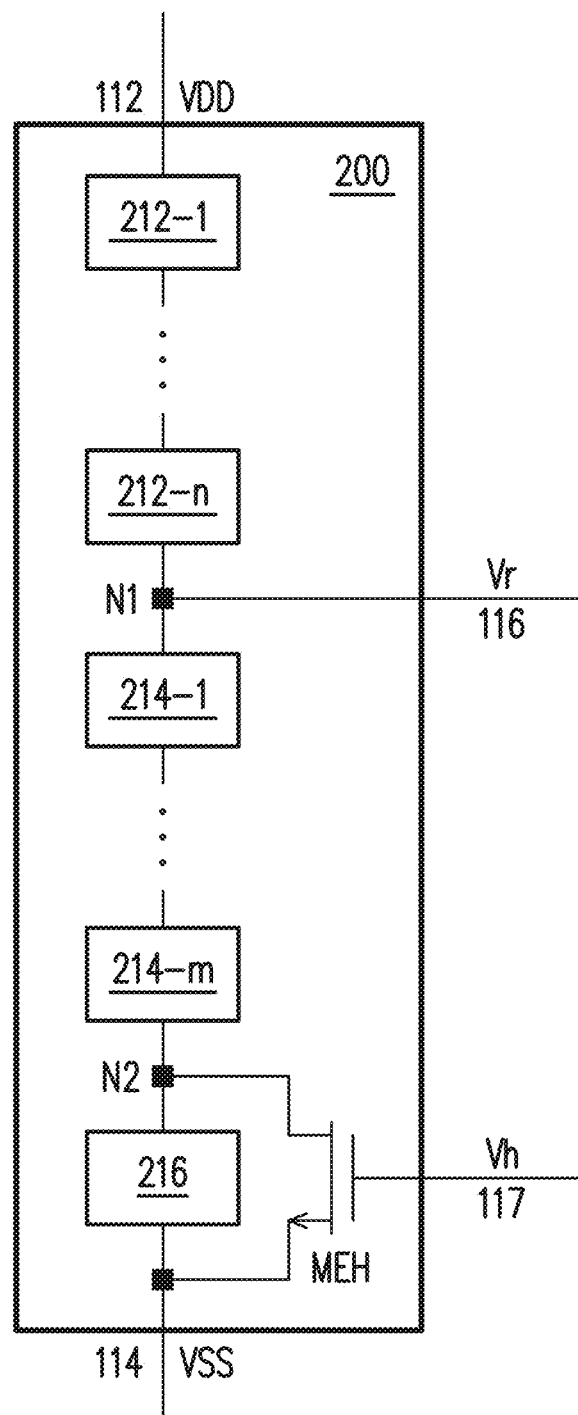

FIGS. 2A-2E are diagrams of voltage divider configurations, in accordance with some embodiments. FIG. 2A depicts voltage divider 200, usable in part or in whole as some or all of voltage divider 115 discussed above with respect to protection circuit 110 and FIG. 1. Each of FIGS. 2B-2E depicts a series component usable in voltage divider 200 as discussed below.

As depicted in FIG. 2A, voltage divider 200 includes series components 212-1 through 212-n, 214-1 through 214-m, and 216 coupled in series between input terminals 112 and 114. Series components 212-n and 214-1 are coupled to each other and to signal path 116 at a node N1, also referred to as a voltage tap in some embodiments, and series components 214-*m* and 216 are coupled to each other at a node N2.

In the embodiment depicted in FIG. 2A, voltage divider 200 includes an enhancement-mode n-type HEMT MEH having a gate coupled to signal path 217, a drain terminal coupled to node N2, and a source terminal coupled to input terminal 114, thereby being arranged in parallel with series component 216. In some embodiments, HEMT MEH is arranged in parallel with one or more series components in addition to or instead of series component 216. In some embodiments, HEMT MEH is a depletion-mode HEMT.

In some embodiments, voltage divider 200 includes one or more n-type HEMTs (not shown) in addition to HEMT MEH, the one or more additional HEMTs having gates coupled to signal path 117 and being arranged in parallel with a corresponding one or more of series components 212-1 through 212-*n* or 214-1 through 214-*m*. In various embodiments, voltage divider 200 does not include one or both of series component 216 or HEMT MEH, and in some embodiments node N2 is directly coupled to input terminal 114.

In operation, a HEMT, e.g., HEMT MEH, arranged in parallel with at least one series component, e.g., series component 216, acts as a bypass device by providing a low resistance path in a switched on state such that the parallel series component is bypassed. In the embodiment depicted in FIG. 2A, HEMT MEH being in the switched on state causes series component 216 to be bypassed such that node N2 has power supply reference voltage level VSS below a voltage level present at node N2 when HEMT MEH is in a switched off state. HEMT MEH being in the switched on state thereby causes voltage Vr to have a voltage level below a voltage level corresponding to HEMT MEH being in the switched off state.

Each of series components 212-1 through 212-*n*, 214-1 through 214-*m*, and 216 is a voltage divider series component as discussed above with respect to voltage divider 115. Each of series components 212-1 through 212-*n* is a same component type and each of series components 214-1 through 214-*m* is a same component type. In various embodiments, series components 212-1 through 212-*n* and series components 214-1 through 214-*m* are a same component type or different component types. In various embodiments, series component 216 is a same component type as one or both of series components 212-1 through 212-*n* or 214-1 through 214-*m* or a component type different from one or more component types of series components 212-1 through 212-*n* and 214-1 through 214-*m*.

Series components 212-1 through 212-*n* include a number n of the same component type. In various embodiments, the number n has a value ranging from 1 to 10 or from 2 to 5. Series components 214-1 through 214-*m* include a number m of the same component type. In various embodiments, the number m has a value ranging from 1 to 10 or from 2 to 5.

In the embodiment depicted in FIG. 2A, voltage divider 200 includes series components 212-1 through 212-*n* and 214-1 through 214-*m* coupled between input terminal 112 and node N2. In various embodiments, voltage divider 200 does not include one of series components 212-1 through 212-*n* or 214-1 through 214-*m* or includes one or more series components (not shown) in addition to series components 212-1 through 212-*n* and 214-1 through 214-*m* coupled between input terminal 112 and node N2.

FIG. 2B depicts a diode device 200D, FIG. 2C depicts an enhancement-mode n-type HEMT 200ME configured as a diode, FIG. 2D depicts a depletion-mode n-type HEMT 200MD configured as a diode, and FIG. 2E depicts a resistive device 200R. Each of diode device 200D, HEMTs 200ME and 200MD, and resistive device 200R is usable as one or more of series components 212-1 through 212-*n*, 214-1 through 214-*m*, or 216. When used as a series component 212-1 through 212-*n*, 214-1 through 214-*m*, or 216, a given one of diode device 200D or HEMTs 200ME or 200MD is configured to have a forward bias based on power supply voltage level VDD at input terminal 112 and power supply reference voltage VSS at input terminal 114.

In some embodiments, each of series components 212-1 through 212-*n* and 214-1 through 214-*m* includes diode device 200D, and series component 216 includes resistive device 200R. In some embodiments, each of series components 212-1 through 212-*n* and 214-1 through 214-*m* includes HEMT 200ME, voltage divider 200 does not include series component 216 or HEMT MEH, and node N2 is directly coupled to input terminal 114.

Voltage divider 200 is thereby configured to, in operation, generate voltage Vr at node N1 by dividing power supply voltage level VDD in accordance with the arrangement of the series components, e.g., series components 212-1 through 212-*n*, 214-1 through 214-*m*, and/or 216, and any bypass devices, e.g., HEMT MEH, corresponding to a given embodiment. Voltage divider 200 is thereby capable of generating voltage Vr having one or more predetermined voltage level ranges that represent a predetermined range of values of power supply voltage level VDD such that voltage Vr is usable to detect power supply voltage level VDD having the under-voltage status based on a predetermined threshold level.

In the embodiment depicted in FIG. 2A, voltage divider 200 is further capable of generating voltage Vr having a second voltage level below a first voltage level based on HEMT MEH being switched on in response to voltage Vh received on signal path 117.

A driver circuit, e.g., driver circuit 100 discussed above with respect to FIG. 1, that includes voltage divider 200 is configured to receive voltage Vr generated as discussed above and is thereby capable of achieving the benefits discussed above with respect to driver circuit 100.

Figure 3:
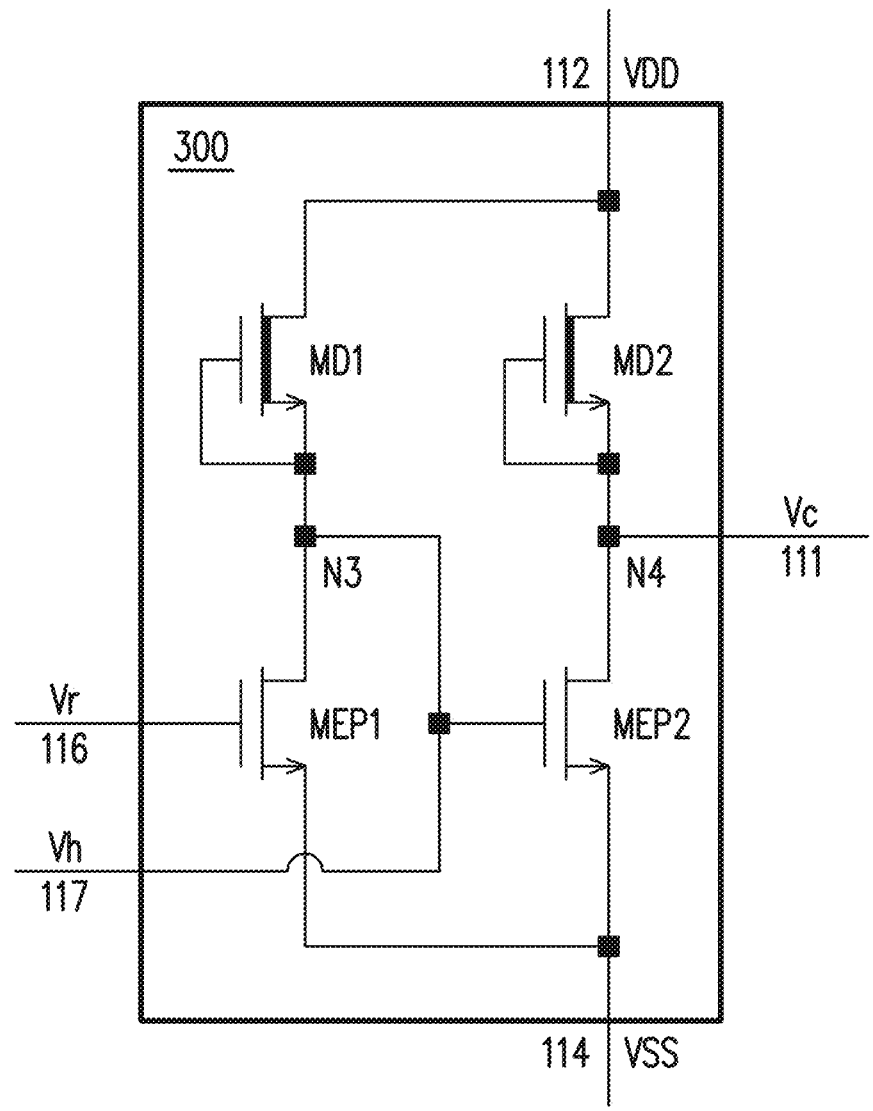
FIG. 3 is a diagram of a detection circuit, in accordance with some embodiments.

FIG. 3 is a diagram of detection circuit 300, in accordance with some embodiments. Detection circuit 300 is usable as some or all of detection circuit 118 discussed above with respect to protection circuit 110 and FIG. 1.

Detection circuit 300 includes a depletion-mode n-type HEMT MD1 and an enhancement-mode n-type HEMT MEP1 coupled in series between input terminals 112 and 114, and a depletion-mode n-type HEMT MD2 and an enhancement-mode n-type HEMT MEP2 coupled in series between input terminals 112 and 114.

Each of HEMTs MD1 and MD2 has a drain terminal coupled to input terminal 112 and a gate coupled to a source terminal, and is thereby configured as a diode. The gate and source terminal of HEMT MD1, a drain terminal of HEMT MEP1, a gate of HEMT MEP2, and signal path 117 are coupled to each other at a node N3. The gate and source terminal of HEMT MD2, a drain terminal of HEMT MEP2, and output terminal 111 are coupled to each other at a node N4. A gate of HEMT MEP1 is coupled to signal path 116 and a drain terminal of each of HEMTs MEP1 and MEP2 is coupled to input terminal 114.

Detection circuit 300 is thereby configured to receive power supply voltage level VDD at input terminal 112 and the drain terminals of HEMTs MD1 and MD2, receive power supply reference voltage level VSS at input terminal 114 and the source terminals of HEMTs MEP1 and MEP2, and receive voltage Vr on signal path 116 and at the gate of HEMT MEP1. Detection circuit 300 is thereby configured also to output voltage Vh from node N3 to signal path 117 and output signal Vc from node N4 to output terminal 111.

In some embodiments, detection circuit 300 does not include a connection between node N3 and signal path 117 such that node N3 is not coupled to signal path 117 and detection circuit 300 is not configured to output voltage Vh to signal path 117.

HEMTs MD1 and MD2 are thereby configured as load transistors coupled between input terminal 112 and nodes N3 and N4, respectively, such that, in operation, each of HEMTs MD1 and MD2 provides a load resistance sufficiently large to cause the corresponding node N3 or N4 to have the logically low voltage level in response to the corresponding HEMT MEP1 or MEP2 being switched on, thereby coupling the corresponding node N3 or N4 to input terminal 114.

HEMT MEP1 is thereby configured to control a voltage level of voltage Vh on node N3 responsive to a voltage level of voltage Vr received at the gate of HEMT MEP1. In operation, voltage Vr having a voltage level equal to or greater than a threshold voltage of HEMT MEP1 causes HEMT MEP1 to be switched on, thereby coupling node N3 to input terminal 114 such that voltage Vh has the logically low voltage level. Voltage Vr having a voltage level less than the threshold voltage of HEMT MEP1 causes HEMT MEP1 to be switched off, thereby decoupling node N3 from input terminal 114 and coupling node N3 to input terminal to 112 through HEMT MD1 such that voltage Vh has the logically high voltage level.

HEMT MEP2 is thereby configured to control a voltage level of signal Vc generated on node N4 based on the voltage level of voltage Vh received at the gate of HEMT MEP2. In operation, voltage Vh having the logically high voltage level greater than a threshold voltage of HEMT MEP2 causes HEMT MEP2 to be switched on, thereby coupling node N4 to input terminal 114 such that signal Vc has the logically low voltage level. Voltage Vh having the logically low voltage level less than the threshold voltage of HEMT MEP2 causes HEMT MEP2 to be switched off, thereby decoupling node N4 from input terminal 114 and coupling node N4 to input terminal 112 through HEMT MD2 such that signal Vc has the logically high voltage level.

Detection circuit 300 is thereby configured to output signal Vc on output terminal 111 responsive to the voltage level of voltage Vr on signal path 116 such that, in operation, detection circuit 300 outputs signal Vc having the logically high voltage level in response to voltage Vr having a voltage level greater than or equal to the threshold voltage of HEMT MEP1 and having the logically low voltage level in response to voltage Vr having a voltage level less than the threshold voltage of HEMT MEP1.

In the embodiment depicted in FIG. 3, detection circuit 300 is further configured to output voltage Vh on signal path 117 responsive to the voltage level of voltage Vr on signal path 116 such that, in operation, detection circuit 300 outputs voltage Vh having the logically low voltage level in response to voltage Vr having a voltage level greater than or equal to the threshold voltage of HEMT MEP1 and having the logically high voltage level in response to voltage Vr having a voltage level less than the threshold voltage of HEMT MEP1.

A driver circuit, e.g., driver circuit 100 discussed above with respect to FIG. 1, that includes detection circuit 300 is configured to receive signal Vc generated as discussed above and is thereby capable of achieving the benefits discussed above with respect to driver circuit 100.

Figure 4:
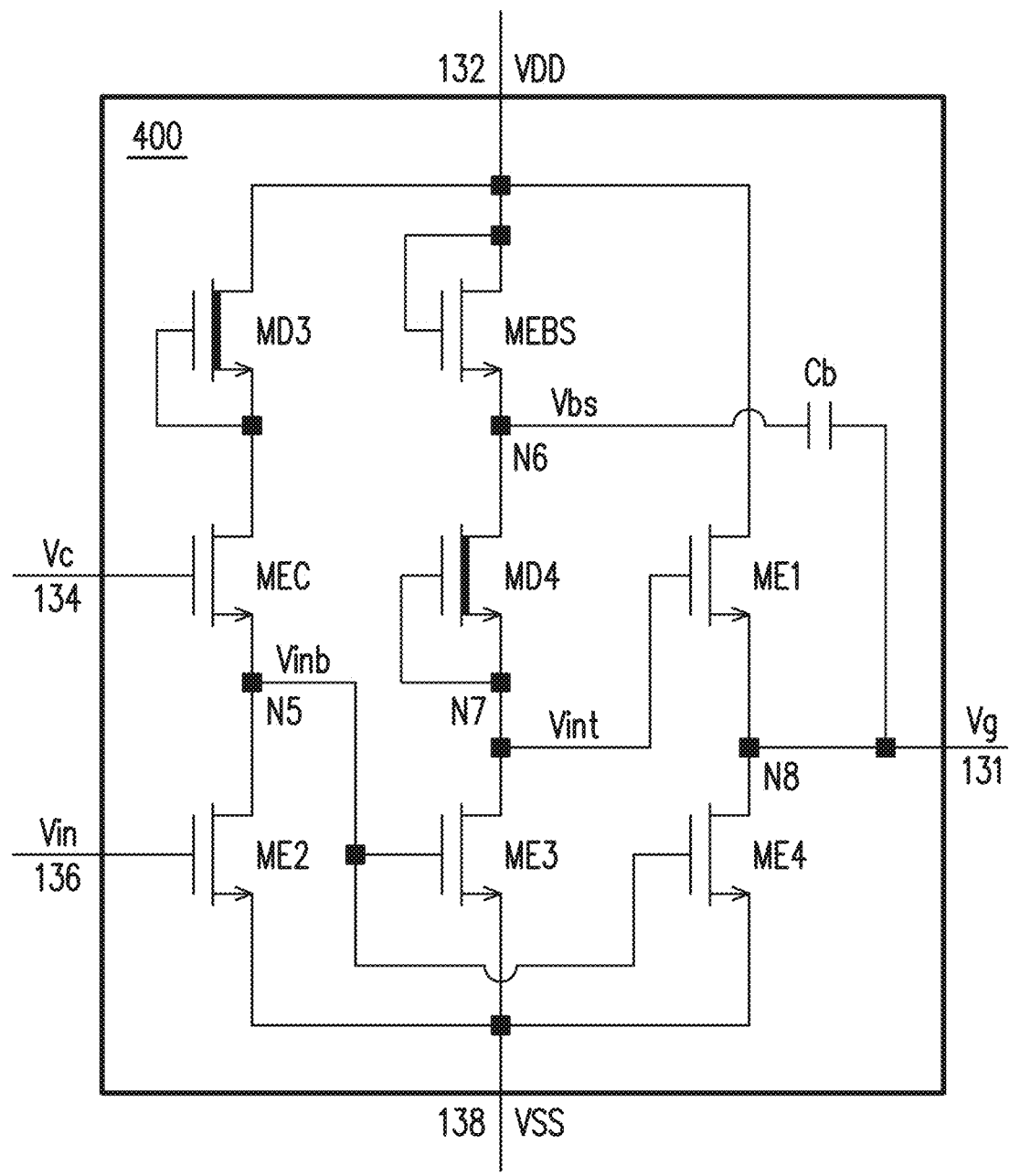
FIG. 4 is a diagram of a gate driver, in accordance with some embodiments.

FIG. 4 is a diagram of gate driver 400, in accordance with some embodiments. Gate driver 400 is usable as some or all of gate driver 130 discussed above with respect to FIG. 1.

Gate driver 400 includes a depletion-mode n-type HEMT MD3 and enhancement-mode n-type HEMTs MEC and ME2 coupled in series between input terminals 132 and 138, an enhancement-mode n-type HEMT MEBS, a depletion-mode n-type HEMT MD4, and an enhancement-mode n-type HEMT ME3 coupled in series between input terminals 132 and 138, enhancement-mode n-type HEMTs ME1 and ME4 coupled in series between input terminals 132 and 138, and a capacitive device Cb coupled between output terminal 131 and HEMTs MEBS and MD4.

HEMT MD3 is configured as a diode having a drain terminal coupled to input terminal 132 and a gate coupled to a source terminal and to a drain terminal of HEMT MEC. A source terminal of HEMT MEC, a drain terminal of HEMT ME2, and gates of HEMTs ME3 and ME4 are coupled to each other at a node N5, and a gate of HEMT MEC is coupled to input terminal 134. A source terminal of HEMT ME2 is coupled to input terminal 138, and a gate of HEMT ME2 is coupled to input terminal 136.

HEMT MEBS is configured as a diode having a gate coupled to a drain terminal and to input terminal 132. A source terminal of HEMT MEBS, a drain terminal of HEMT MD4, and a first terminal of capacitive device Cb are coupled to each other at a node N6. HEMT MD4 is configured as a diode having a gate coupled to a source terminal and to a drain terminal of HEMT ME3 and a gate of HEMT ME1 at a node N7. HEMT ME3 has a source terminal coupled to input terminal 138.

HEMT ME1 has a drain terminal coupled to input terminal 132 and a source terminal coupled to a drain terminal of HEMT ME4 and to a second terminal of capacitive device Cb at a node N8. A source terminal of HEMT ME4 is coupled to input terminal 138.

Gate driver 400 is thereby configured to receive power supply voltage level VDD at input terminal 132 and the drain terminals of HEMTs MD3, MEBS, and ME1, receive power supply reference voltage level VSS at input terminal 138 and the source terminals of HEMTs ME2, ME3, and ME4, receive signal Vc at input terminal 134 and the gate of HEMT MEC, and receive signal Vin at input terminal 136 and the gate of HEMT ME2. Gate driver 400 is thereby configured also to output signal Vg from node N8 to output terminal 131.

HEMT MD3 is thereby configured as a load transistor coupled between input terminal 132 and HEMT MEC such that, in operation, HEMT MD3 provides a load resistance sufficiently large to cause node N5 to have the logically low voltage level in response to each of HEMTs MEC and ME2 being switched on, thereby coupling HEMT MD3 and node N5 to input terminal 138.

HEMT MEC is thereby configured to partially control a voltage level of a signal Vinb on node N5 responsive to the voltage level of signal Vc received at the gate of HEMT MEC, and HEMT ME2 is thereby configured to partially control the voltage level of signal Vinb responsive to the voltage level of signal Vin received at the gate of HEMT ME2. In operation, signal Vc having the logically high voltage level causes HEMT MEC to be switched on, thereby coupling node N5 to input terminal 132 through HEMTs MD3 and MEC such that signal Vinb is controlled by HEMT ME2 based on the voltage level of signal Vin. In this case, signal Vin having the logically high voltage level causes HEMT ME2 to be switched on, thereby coupling node N5 to input terminal 138 such that signal Vinb has the logically low voltage level, and signal Vin having the logically low voltage level causes HEMT ME2 to be switched off, thereby decoupling node N5 from input terminal 138 and coupling node N5 to input terminal 132 through HEMTs MEC and MD3 such that signal Vinb has the logically high voltage level. Gate driver 400 is thereby configured to generate signal Vinb as the complement of signal Vin in response to signal Vc having the logically high voltage level.

In operation, signal Vc having the logically low voltage level causes HEMT MEC to be switched off, thereby decoupling node N5 from input terminal 132 such that signal Vinb has the logically low voltage level independent of the voltage level of signal Vin and switched status of HEMT ME2.

By the configuration discussed above, HEMTs MD4 and ME3 are arranged as a DCFL circuit configured to generate a voltage Vint at node N7 responsive to signal Vinb received at the gate of HEMT ME3. HEMTs ME1 and ME4 are arranged as a buffer amplifier configured to generate signal Vg at node N8 responsive to voltage Vint at the gate of HEMT ME1 and signal Vinb at the gate of HEMT ME4. HEMT MEBS and capacitive device Cb are arranged as a bootstrap power supply block coupled to the DCFL circuit at node N6.

In operation, signal Vinb having the logically high voltage level causes each of HEMTs ME3 and ME4 to be switched on, thereby coupling respective nodes N7 and N8 to input terminal 138. Based on the loading presented by the diode-configurations of HEMTs MEBS and MD4, coupling node N7 to input terminal 138 causes voltage Vint to have the logically low voltage level and a voltage Vbs at node N6 to have a voltage level between the logically low level and power supply voltage level VDD. Vint having the logically low voltage level causes HEMT ME1 to be switched off such that node N8 being coupled to input terminal 138 causes signal Vg to have the logically low voltage level. A voltage difference between the voltage level of voltage Vbs at node N6 and the logically low voltage level of signal Vg at node N8 is thereby present across capacitive device Cb.

In operation, signal Vinb transitioning from the logically high voltage level to the logically low voltage level causes each of HEMTs ME3 and ME4 to be switched off, thereby decoupling each of nodes N7 and N8 from input terminal 138. In response, voltage Vint at node N7 is pulled upward through HEMT MD4, and signal Vg at node N8 is pulled upward through HEMT ME1. Initially, the voltage difference across capacitive device Cb drives voltage Vbs at node N6, and thereby voltage Vint at node N7 upward to voltage levels greater than power supply voltage level VDD, enabled by HEMT MEBS having a reverse bias diode configuration. The relative voltage levels of voltage Vint and signal Vg at the respective gate and source terminal of HEMT ME1 cause HEMT ME1 to be switched on, thereby driving signal Vg to the logically high voltage level.

In an AC operation, e.g., when signal Vc has the logically high voltage level and signal Vinb is generated based on signal Vin, HEMT ME1 is switched on for a duration sufficiently long such that signal Vg is generated having the logically high voltage level in response to signal Vinb having the logically low voltage level.

In a DC operation, e.g., when signal Vc has the logically low voltage level and signal Vinb is generated having the logically low voltage level independent of signal Vin, leakage currents cause voltages Vbs and Vint to decay such that HEMT ME1 is no longer switched on to drive signal Vg to the logically high voltage level, and signal Vg is therefore generated having the logically low voltage level.

Gate driver 400 is thereby configured to generate signal Vg responsive to signal Vin when signal Vc has the logically high voltage level, and having the logically low voltage level when signal Vc has the logically low voltage level. Thus, a driver circuit, e.g., driver circuit 100 discussed above with respect to FIG. 1, that includes gate driver 400 is configured to output signal Vg corresponding to operational and lockout modes as discussed above and is thereby capable of achieving the benefits discussed above with respect to driver circuit 100.

Figure 5:
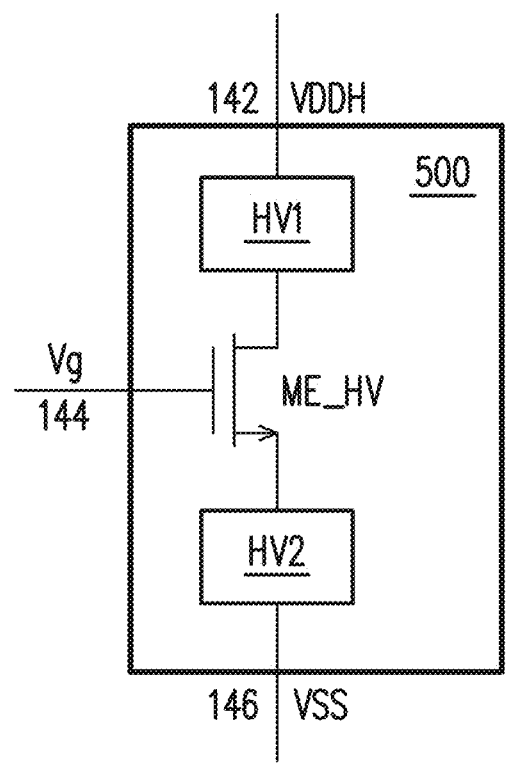
FIG. 5 is a diagram of a high voltage circuit, in accordance with some embodiments.

FIG. 5 is a diagram of HV circuit 500, in accordance with some embodiments. HV circuit 500 is usable as some or all of HV circuit 140 discussed above with respect to FIG. 1.

HV circuit 500 includes an n-type HEMT ME_HV, also referred to as a switching device in some embodiments, and sub-circuits HV1 and HV2 coupled in series between input terminals 142 and 146. HEMT ME_HV includes a drain terminal coupled to a first terminal (not labeled) of sub-circuit HV1, a source terminal coupled to a first terminal (not labeled) of sub-circuit HV2, and a gate coupled to input terminal 144. HV circuit 500 is thereby configured to receive power supply voltage level VDDH at a second terminal (not labeled) of sub-circuit HV1, power supply reference voltage level VSS at a second terminal (not labeled) of sub-circuit HV2, and signal Vg at the gate of HEMT ME_HV.

Each of sub-circuits HV1 and HV2 is an electronic circuit including one or more circuit components (not shown) configured to perform a predetermined function responsive to power supply voltage level VDDH, power supply reference voltage level VSS, and one or more signals or other inputs (not shown), in some embodiments. In some embodiments, the circuit components include n-type transistors, e.g., depletion-mode and/or enhancement-mode HEMTs. In various embodiments, sub-circuits HV1 and/or HV2 are some or all of a power or voltage conversion circuit, a power or voltage regulation circuit, a lighting circuit, or the like. Additional details of the circuit components and various configurations of sub-circuits HV1 and HV2 are not depicted or further discussed for the purpose of clarity.

In the embodiment depicted in FIG. 5, HEMT ME_HV is an enhancement-mode HEMT, and HV circuit 500 is thereby configured to couple sub-circuits HV1 and HV2 to each other in response to signal Vg having the logically high voltage level in a first switching operation, and to decouple sub-circuits HV1 and HV2 from each other in response to signal Vg having the logically low voltage level in a second switching or lockout operation. In some embodiments, HEMT ME_HV is a depletion-mode HEMT, and HV circuit 500 is thereby configured to couple sub-circuits HV1 and HV2 to each other in response to signal Vg having the logically low voltage level in a first switching operation, and to decouple sub-circuits HV1 and HV2 from each other in response to signal Vg having the logically high voltage level in a second switching or lockout operation.

In some embodiments, HV circuit 500 includes, in addition to HEMT ME_HV, at least one additional n-type HEMT (not shown) including a gate coupled to input terminal 144 or otherwise configured to receive signal Vg, and is thereby configured to couple/decouple two or more components, e.g., sub-circuits HV1 and/or HV2, to/from each other in a switching operation.

In some embodiments, HV circuit 500 does not include sub-circuit HV1, and HV circuit 500 is configured to receive power supply voltage level VDDH at the drain of HEMT ME_HV and, in operation, couple input terminal 142 and sub-circuit HV2 to each other in the first switching operation and decouple input terminal 142 and sub-circuit HV2 from each other in the second switching or lockout operation. In some embodiments, HV circuit 500 does not include sub-circuit HV2, and HV circuit 500 is configured to receive power supply reference voltage level VSS at the source of HEMT ME_HV and, in operation, couple sub-circuit HV1 and input terminal 146 to each other in the first switching operation and decouple sub-circuit HV1 and input terminal 146 from each other in the second switching or lockout operation. In some embodiments, HV circuit 500 does not include sub-circuits HV1 and HV2, and HV circuit 500 is configured to receive power supply voltage level VDDH at the drain of HEMT ME_HV, receive power supply reference voltage level VSS at the source of HEMT ME_HV, and, in operation, couple input terminals 142 and 146 to each other in the first switching operation and decouple input terminals 142 and 146 from each other in the second switching or lockout operation.

HV circuit 500 is thereby configured to execute one or more switching and lockout operations responsive to signal Vg. Thus, a driver circuit, e.g., driver circuit 100 discussed above with respect to FIG. 1, that includes HV circuit 500 is configured to respond to signal Vg corresponding to operational and lockout modes as discussed above and is thereby capable of achieving the benefits discussed above with respect to driver circuit 100.

Figure 6:
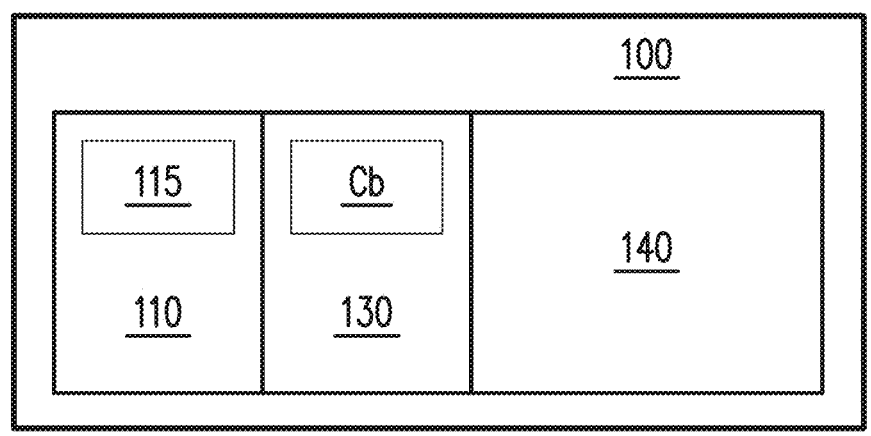
FIG. 6 depicts a non-limiting example of an IC plan view of a driver circuit, in accordance with some embodiments.

FIG. 6 depicts a non-limiting example of an IC plan view of driver circuit 100, in accordance with some embodiments. In the embodiment depicted in FIG. 6, driver circuit 100 includes protection circuit 110, gate driver 130, and HV circuit 140, each discussed above with respect to FIG. 1.

FIG. 6 depicts protection circuit 110 including voltage divider 115, discussed above with respect to FIGS. 1 and 2A-2E, and gate driver 130 including capacitive device Cb, discussed above with respect to FIG. 4. Voltage divider 115 and capacitive device Cb are positioned and have relative sizes depicted in FIG. 6 for the purpose of illustration. In various embodiments, driver circuit 100 includes voltage divider 115 and a capacitive device, e.g., capacitive device Cb, having positioning and/or relative sizes other than those depicted in FIG. 6.

In the embodiment depicted in FIG. 6, gate driver 130 is positioned adjacent to protection circuit 110 and is thereby configured to receive signal Vc (not shown in FIG. 6) from protection circuit 110, and HV circuit 140 is positioned adjacent to gate driver 130 and is thereby configured to receive signal Vg (not shown in FIG. 6) from gate driver 130. In various embodiments, driver circuit 100 includes gate driver 130 otherwise configured to receive signal Vc from protection circuit 110 and/or HV circuit 140 otherwise configured to receive signal Vg from gate driver 130.

In some embodiments, driver circuit 100 includes signal generator 120 (not shown in FIG. 6) positioned adjacent to one or both of protection circuit 110 or gate driver 130 and gate driver 130 is thereby configured to receive signal Vin (not shown in FIG. 6) from signal generator 120. In some embodiments, an IC including driver circuit 100 includes one or more HV circuits (not shown) in addition to HV circuit 140 and positioned adjacent to one or both of gate driver 130 or HV circuit 140, and driver circuit 100 is thereby configured to provide signal Vg to the one or more HV circuits.

As illustrated by the non-limiting example of FIG. 6, driver circuit 100 including or integrated with HV circuit 140 is part of a single IC capable of being manufactured using NMOS-based processes in which Si-based devices are integrated with HV devices without requiring additional masks for p-type devices and thereby achieves the benefits discussed above with respect to driver circuit 100.

Figure 7:
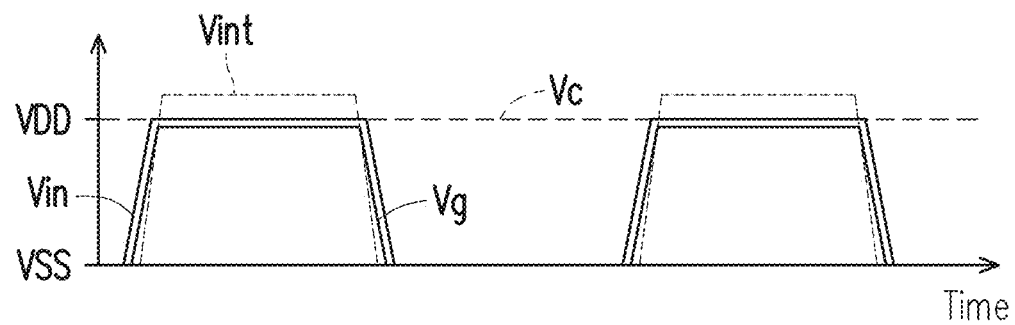
FIG. 7 depicts driver circuit operating parameters, in accordance with some embodiments.
Figure 7:
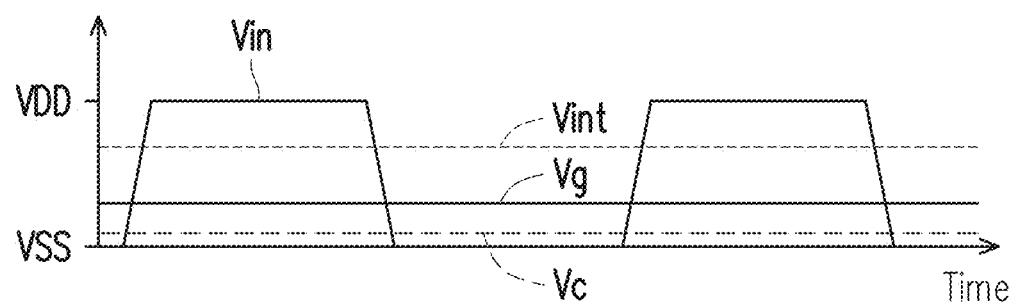

FIG. 7 depicts operating parameters of driver circuit 100, in accordance with some embodiments. FIG. 7 depicts non-limiting examples of each of signals Vc, Vin, and Vg and voltage Vint relative to power supply voltage level VDD and power supply reference voltage level VSS for a first case in which power supply voltage level VDD is greater than or equal to a threshold voltage level Vth and a second case in which power supply voltage level VDD is less than threshold voltage level Vth. In both cases, gate driver 130 receives signal Vin, e.g., generated by signal generator 120, varying over time between power supply voltage level VDD and power supply reference voltage level VSS.

In the non-limiting example of the first case depicted in FIG. 7, power supply voltage level VDD being greater than or equal to threshold voltage level Vth causes protection circuit 110 to generate signal Vc having the logically high voltage level near power supply voltage level VDD.

In response to signal Vc having the logically high voltage level, gate driver 130 generates an internal voltage, represented by the non-limiting example of voltage Vint discussed above with respect to FIG. 4, that tracks signal Vin and has a peak value greater than power supply voltage level VDD. Based on the internal voltage, e.g., voltage Vint, gate driver 130 generates signal Vg tracking signal Vin and varying between power supply voltage level VDD and power supply reference voltage level VSS.

In the non-limiting example of the second case depicted in FIG. 7, power supply voltage level VDD being less than threshold voltage level Vth causes protection circuit 110 to generate signal Vc having the logically low voltage level near power supply reference voltage level VSS.

In response to signal Vc having the logically low voltage level, gate driver 130 generates the internal voltage, e.g., voltage Vint having a voltage level between power supply voltage level VDD and power supply reference voltage level VSS. Based on the internal voltage, e.g., voltage Vint, gate driver 130 generates signal Vg having a voltage level within the range of voltage levels (not labeled) corresponding to the logically low voltage level.

Figure 8:
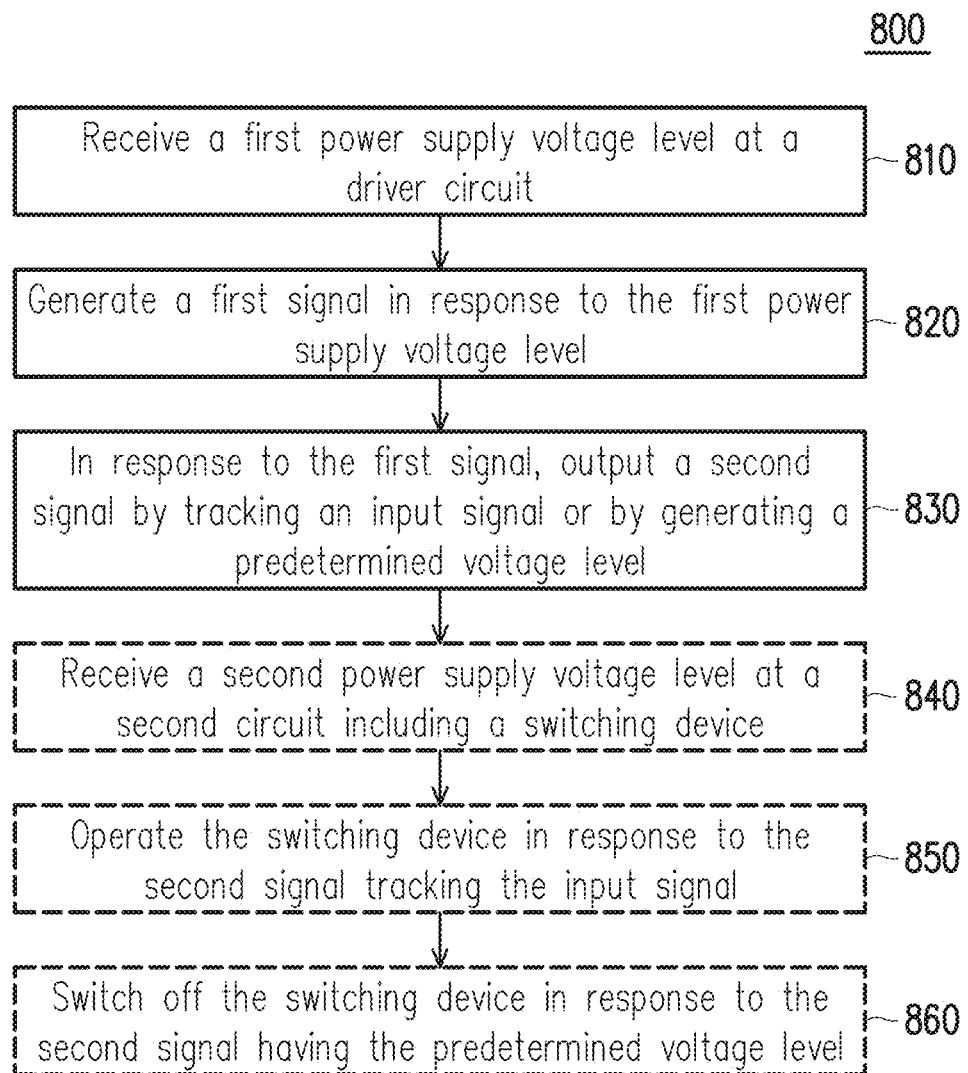
FIG. 8 is a flowchart of a method of operating a driver circuit, in accordance with some embodiments.

FIG. 8 is a flowchart of a method 800 of method of operating a driver circuit, in accordance with one or more embodiments. In some embodiments, method 800 is implemented to generate signal Vg responsive to power supply voltage level VDD as discussed above with respect to FIGS. 1-7.

In some embodiments, the operations of method 800 are performed in the order depicted in FIG. 8. In some embodiments, the operations of method 800 are performed simultaneously and/or in an order other than the order depicted in FIG. 8. In some embodiments, one or more operations are performed before, between, during, and/or after performing one or more operations of method 800.

In various embodiments, some or all of the operations of method 800 are performed as part of operating a circuit that includes a driver circuit, e.g., operating a power or voltage conversion or regulation circuit, a lighting circuit, or the like.

At operation 810, a first power supply voltage level is received at a driver circuit. Receiving the first power supply voltage level includes receiving the first power supply voltage level from a voltage source. In some embodiments, receiving the first power supply voltage level includes receiving the first power supply voltage level from a battery.

The driver circuit includes at least one depletion-mode or enhancement-mode n-type HEMT. In some embodiments, receiving the first power supply voltage level at the driver circuit includes receiving power supply voltage level VDD at driver circuit 100 discussed above with respect to FIGS. 1-7.

In some embodiments, receiving the first power supply voltage level at the driver circuit includes dividing the first power supply voltage level using a voltage divider to generate a first voltage. In some embodiments, using the voltage divider to generate the first voltage includes using voltage divider 115 or 200 to generate voltage Vr discussed above with respect to driver circuit 100 and FIGS. 1-2E.

In some embodiments, receiving the first power supply voltage level at the driver circuit includes detecting whether the first power supply voltage level is at or above a predetermined threshold voltage level or below the threshold voltage level. In some embodiments detecting the first power supply voltage level includes receiving the first voltage. In some embodiments, detecting the first power supply voltage level includes receiving voltage Vr at detection circuit 118 or 300 discussed above with respect to driver circuit 100 and FIGS. 1 and 3.

In some embodiments, using the voltage divider comprises bypassing at least one series component of the voltage divider in response to the power supply voltage level being less than a threshold voltage level. In some embodiments, bypassing the at least one series component of the voltage divider is part of a hysteresis operation. In some embodiments, bypassing the at least one series component of the voltage divider includes switching on a HEMT configured in parallel with the at least one series component of the voltage divider. In some embodiments, bypassing the at least one series component of the voltage divider includes switching on HEMT MEH discussed above with respect to voltage divider 200 and FIGS. 2A-2E.

In some embodiments, switching on the HEMT includes switching on the HEMP in response to a second voltage generated in response to the first voltage. In some embodiments, switching on the HEMT includes switching on the HEMP in response to voltage Vh generated by detection circuit 118 or 300 discussed above with respect to FIGS. 1-3.

At operation 820, a first signal is generated in response to the first power supply voltage level. Generating the first signal includes generating the first signal having one of a logically high or low voltage level in response to the first power supply voltage level being equal to or greater than the threshold voltage level and the other of the logically high or low voltage level in response to the first power supply voltage level being less than the threshold voltage level. Generating the first signal in response to the first power supply voltage level being equal to or greater than the threshold voltage level corresponds to operating the driver circuit in an operational mode, and generating the first signal in response to the first power supply voltage level being less than the threshold voltage level corresponds to operating the driver circuit in a lockout mode.

Generating the first signal includes generating the first signal using at least one depletion-mode or enhancement-mode n-type HEMT. In some embodiments, generating the first signal includes generating signal Vc using protection circuit 110 discussed above with respect to driver circuit 100 and FIGS. 1-7.

In some embodiments, generating the first signal includes receiving the first voltage at a gate of a first n-type HEMT and using the first HEMT to control a second voltage at a gate of a second HEMT. In some embodiments, using the first HEMT to control the second voltage at the gate of the second HEMT includes using HEMT MEP1 to control voltage Vh at the gate of HEMT MEP2 discussed above with respect to detection circuit 300 and FIG. 3.

At operation 830, in response to the first signal, a second signal is output by tracking an input signal or by generating a predetermined voltage level. Outputting the second signal by tracking the input signal is in response to the first signal having the one of the logically high or low voltage level corresponding to the first power supply voltage level being equal to or greater than the threshold voltage level and outputting the second signal by generating a predetermined voltage level is in response to the first signal having the other of the logically high or low voltage level corresponding to the first power supply voltage level being less than the threshold voltage level.

Outputting the second signal includes generating the second signal using at least one depletion-mode or enhancement-mode n-type HEMT. In some embodiments, generating the second signal includes generating signal Vg using gate driver 130 or 400 discussed above with respect to driver circuit 100 and FIGS. 1-7.

In some embodiments, outputting the second signal includes receiving the input signal. In some embodiments, receiving the input signal includes receiving input signal Vin discussed above with respect to driver circuit 100 and FIGS. 1-7. In some embodiments, receiving the input signal includes generating input signal Vin using signal generator 120 discussed above with respect to driver circuit 100 and FIG. 1.

In some embodiments, tracking the input signal includes using a bootstrap circuit to drive a gate of an n-type HEMT to a voltage level greater than the first power supply voltage level, and generating the predetermined voltage level includes switching off the n-type HEMT. In some embodiments, tracking the input signal and generating the predetermined voltage level include respectively driving and switching off HEMT ME1 discussed above with respect to gate driver 400 and FIG. 4.

At operation 840, in some embodiments, a second power supply voltage level is received at a second circuit including a switching device. The second power supply voltage level is greater than the first power supply voltage level and the switching device includes a HEMT. In some embodiments, receiving the second power supply voltage level at the second circuit includes receiving power supply voltage level VDDH at HV circuit 140 discussed above with respect to driver circuit 100 and FIGS. 1 and 7.

In some embodiments, receiving the second power supply voltage level at the second circuit includes receiving the second signal at the second circuit. In some embodiments, receiving the second signal includes receiving signal Vg discussed above with respect to FIGS. 1-7.

In some embodiments, receiving the second signal includes receiving the second signal at a gate of the switching device. In some embodiments, receiving the second signal includes receiving signal Vg at the gate of HEMT ME_HV discussed above with respect to HV circuit 500 and FIG. 5.

At operation 850, in some embodiments, the switching device is operated in response to the second signal tracking the input signal. In some embodiments, operating the switching device in response to the second signal tracking the input signal includes operating HEMT ME_HV in response to signal Vg tracking input signal Vin discussed above with respect to FIGS. 1-7.

At operation 860, in some embodiments, the switching device is switched off in response to the second signal having the predetermined voltage level. In some embodiments, switching off the switching device in response to the second signal having the predetermined voltage level includes switching off HEMT ME_HV in response to signal Vg having the logically low voltage level discussed above with respect to FIGS. 1-7.

By executing some or all of the operations of method 800, a driver circuit including n-type HEMTs generates a signal capable of controlling a HEMT switching device by tracking an input signal in an operational mode and having a predetermined voltage level in a lockout mode, thereby realizing the benefits discussed above with respect to driver circuit 100.

In some embodiments, a circuit includes a power supply node, a power supply reference node, a protection circuit including a first output terminal and first and second series of n-type high electron mobility transistors (HEMTs) coupled between the power supply node and the power supply reference node, and a gate driver including a second output terminal and third through fifth series of n-type HEMTs coupled between the power supply node and the power supply reference node. The first series of n-type HEMTs is configured to control a first voltage on a first node responsive to a power supply voltage on the power supply node, the second series of n-type HEMTs is configured to control a second voltage on the first output terminal responsive to the first voltage, the third series of n-type HEMTs is configured to control an internal signal on a second node responsive to the second voltage and to an input signal, the fourth series of n-type HEMTs is configured to control a third voltage on a third node responsive to the internal signal, and the fifth series of n-type HEMTs is configured to control an output signal at the second output terminal responsive to the internal signal and the third voltage. In some embodiments, the protection circuit includes a voltage divider configured to generate a fourth voltage based on the power supply voltage, the first series of n-type HEMTs includes a depletion-mode n-type HEMT coupled between the power supply node and the first node and a first enhancement-mode n-type HEMT coupled between the first node and the power supply reference node, the depletion-mode n-type HEMT is configured as a diode, and the first enhancement-mode n-type HEMT includes a gate configured to receive the fourth voltage. In some embodiments, the voltage divider includes a series of voltage divider components coupled between the power supply node and the power supply reference node and a second enhancement-mode n-type HEMT arranged in parallel with a first voltage divider component of the series of voltage divider components, wherein the series of voltage divider components includes a voltage tap coupled to the gate of the first enhancement-mode n-type HEMT and the second enhancement-mode n-type HEMT includes a gate coupled to the first node. In some embodiments, the second series of n-type HEMTs includes a depletion-mode n-type HEMT coupled between the power supply node and the first output terminal and an enhancement-mode n-type HEMT coupled between the first output terminal and the power supply reference node, the depletion-mode n-type HEMT is configured as a diode, and the enhancement-mode n-type HEMT includes a gate coupled to the first node. In some embodiments, the third series of n-type HEMTs includes a depletion-mode n-type HEMT and a first enhancement-mode n-type HEMT coupled between the power supply node and the second node and a second enhancement-mode n-type HEMT coupled between the second node and the power supply reference node, the depletion-mode n-type HEMT is configured as a diode, the first enhancement-mode n-type HEMT includes a gate coupled to the first output terminal, and the second enhancement-mode n-type HEMT includes a gate configured to receive the input signal. In some embodiments, the fourth series of n-type HEMTs includes a first enhancement-mode n-type HEMT, a fourth node, and a depletion-mode n-type HEMT coupled between the power supply node and the third node, and a second enhancement-mode n-type HEMT coupled between the third node and the power supply reference node, each of the first enhancement-mode n-type HEMT and the depletion-mode n-type HEMT is configured as a diode, and the second enhancement-mode n-type HEMT includes a gate coupled to the third node. In some embodiments, the circuit includes a capacitive device coupled between the fourth node and the second output terminal. In some embodiments, the fifth series of n-type HEMTs includes a first enhancement-mode n-type HEMT coupled between the power supply node and the second output terminal and a second enhancement-mode n-type HEMT coupled between the second output terminal and the power supply reference node, the first enhancement-mode n-type HEMT includes a gate coupled to the third node, and the second enhancement-mode n-type HEMT includes a gate coupled to the second node. In some embodiments, the power supply node is configured to receive a power supply voltage level from a battery.

In some embodiments, an IC includes first and second power supply nodes, a power supply reference node, a protection circuit including a first output terminal and first and second series of n-type HEMTs coupled between the first power supply node and the power supply reference node, a gate driver including a second output terminal and third through fifth series of n-type HEMTs coupled between the first power supply node and the power supply reference node, and an n-type HEMP switching device coupled between the second power supply node and the power supply reference node. The first series of n-type HEMTs is configured to control a first voltage on a first node responsive to a first power supply voltage on the first power supply node, the second series of n-type HEMTs is configured to control a second voltage on the first output terminal responsive to the first voltage, the third series of n-type HEMTs is configured to control an internal signal on a second node responsive to the second voltage and to an input signal, the fourth series of n-type HEMTs is configured to control a third voltage on a third node responsive to the internal signal, the fifth series of n-type HEMTs is configured to control an output signal at the second output terminal responsive to the internal signal and the third voltage, and the n-type HEMP switching device is configured to couple a first sub-circuit to one of the second power supply node, the power supply reference node, or a second sub-circuit responsive to the output signal. In some embodiments, the protection circuit includes a voltage divider configured to generate a fourth voltage based on the power supply voltage, the first series of n-type HEMTs includes a first depletion-mode n-type HEMT coupled between the power supply node and the first node and a first enhancement-mode n-type HEMT coupled between the first node and the power supply reference node, the second series of n-type HEMTs includes a second depletion-mode n-type HEMT coupled between the power supply node and the first output terminal and a second enhancement-mode n-type HEMT coupled between the first output terminal and the power supply reference node, each of the first and second depletion-mode n-type HEMTs is configured as a diode, the first enhancement-mode n-type HEMT includes a gate configured to receive the fourth voltage, and the second enhancement-mode n-type HEMT includes a gate coupled to the first node. In some embodiments, the voltage divider includes a series of voltage divider components coupled between the power supply node and the power supply reference node and a third enhancement-mode n-type HEMT arranged in parallel with a first voltage divider component of the series of voltage divider components, the series of voltage divider components includes a voltage tap coupled to the gate of the first enhancement-mode n-type HEMT, and the third enhancement-mode n-type HEMT includes a gate coupled to the first node. In some embodiments, the fourth series of n-type HEMTs includes a first enhancement-mode n-type HEMT, a fourth node, and a depletion-mode n-type HEMT coupled between the power supply node and the third node and a second enhancement-mode n-type HEMT coupled between the third node and the power supply reference node, each of the first enhancement-mode n-type HEMT and the depletion-mode n-type HEMT is configured as a diode, the second enhancement-mode n-type HEMT includes a gate coupled to the third node, and the circuit includes a capacitive device coupled between the fourth node and the second output terminal. In some embodiments, the n-type HEMP switching device includes a gate coupled to the second output terminal. In some embodiments, the first sub-circuit includes some or all of a power or voltage conversion circuit or a power or voltage regulation circuit. In some embodiments, the gate driver is positioned between the protection circuit and the n-type HEMP switching device and adjacent to each of the protection circuit and the n-type HEMP switching device.

In some embodiments, a method of operating a driver circuit includes receiving a first power supply voltage on a first power supply node, in response to the first power supply voltage, using a first series of n-type HEMTs coupled between the power supply node and a power supply reference node to control a first voltage on a first node, in response to the first voltage, using a second series of n-type HEMTs coupled between the power supply node and the power supply reference node to control a second voltage on a first output terminal, in response to the second voltage and an input signal, using a third series of n-type HEMTs coupled between the power supply node and the power supply reference node to control an internal signal on a second node, in response to the internal signal, using a fourth series of n-type HEMTs coupled between the power supply node and the power supply reference node to control a third voltage on a third node, and in response to the internal signal and the third voltage, using a fifth series of n-type HEMTs coupled between the power supply node and the power supply reference node to control an output signal at a second output terminal. In some embodiments, receiving the first power supply voltage on the first power supply node includes receiving the first power supply voltage from a battery. In some embodiments, using the fifth series of n-type HEMTs to control the output signal at the second output terminal includes using a capacitive device coupled between the fourth series of n-type HEMTs and the second output terminal. In some embodiments, the method includes, in response to the output signal, using an n-type HEMP switching device to couple a first sub-circuit to one of the power supply reference node, a second sub-circuit, or a second power supply node configured to receive a second power supply voltage greater than the first power supply voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
a power supply node;
a power supply reference node;
a protection circuit comprising a first output terminal and first and second series of n-type high electron mobility transistors (HEMTs) coupled between the power supply node and the power supply reference node; and
a gate driver comprising a second output terminal and third through fifth series of n-type HEMTs coupled between the power supply node and the power supply reference node,
wherein
the first series of n-type HEMTs is configured to control a first voltage on a first node responsive to a power supply voltage on the power supply node,
the second series of n-type HEMTs is configured to control a second voltage on the first output terminal responsive to the first voltage,
the third series of n-type HEMTs is configured to control an internal signal on a second node responsive to the second voltage and to an input signal,
the fourth series of n-type HEMTs is configured to control a third voltage on a third node responsive to the internal signal, and
the fifth series of n-type HEMTs is configured to control an output signal at the second output terminal responsive to the internal signal and the third voltage.

2. The circuit of claim 1, wherein
the protection circuit further comprises a voltage divider configured to generate a fourth voltage based on the power supply voltage,
the first series of n-type HEMTs comprises a depletion-mode n-type HEMT coupled between the power supply node and the first node and a first enhancement-mode n-type HEMT coupled between the first node and the power supply reference node,
the depletion-mode n-type HEMT is configured as a diode, and
the first enhancement-mode n-type HEMT comprises a gate configured to receive the fourth voltage.

3. The circuit of claim 2, wherein
the voltage divider comprises:
a series of voltage divider components coupled between the power supply node and the power supply reference node; and
a second enhancement-mode n-type HEMT arranged in parallel with a first voltage divider component of the series of voltage divider components,
wherein
the series of voltage divider components comprises a voltage tap coupled to the gate of the first enhancement-mode n-type HEMT, and the second enhancement-mode n-type HEMT comprises a gate coupled to the first node.

4. The circuit of claim 1, wherein
the second series of n-type HEMTs comprises a depletion-mode n-type HEMT coupled between the power supply node and the first output terminal and an enhancement-mode n-type HEMT coupled between the first output terminal and the power supply reference node,
the depletion-mode n-type HEMT is configured as a diode, and
the enhancement-mode n-type HEMT comprises a gate coupled to the first node.

5. The circuit of claim 1, wherein
the third series of n-type HEMTs comprises:
   a depletion-mode n-type HEMT and a first enhancement-mode n-type HEMT coupled between the power supply node and the second node; and
   a second enhancement-mode n-type HEMT coupled between the second node and the power supply reference node,
the depletion-mode n-type HEMT is configured as a diode,
the first enhancement-mode n-type HEMT comprises a gate coupled to the first output terminal, and
the second enhancement-mode n-type HEMT comprises a gate configured to receive the input signal.

6. The circuit of claim 1, wherein
the fourth series of n-type HEMTs comprises:
   a first enhancement-mode n-type HEMT, a fourth node, and a depletion-mode n-type HEMT coupled between the power supply node and the third node; and
   a second enhancement-mode n-type HEMT coupled between the third node and the power supply reference node,
each of the first enhancement-mode n-type HEMT and the depletion-mode n-type HEMT is configured as a diode, and
the second enhancement-mode n-type HEMT comprises a gate coupled to the third node.

7. The circuit of claim 6, further comprising:
a capacitive device coupled between the fourth node and the second output terminal.

8. The circuit of claim 1, wherein
the fifth series of n-type HEMTs comprises:
   a first enhancement-mode n-type HEMT coupled between the power supply node and the second output terminal; and
   a second enhancement-mode n-type HEMT coupled between the second output terminal and the power supply reference node,
the first enhancement-mode n-type HEMT comprises a gate coupled to the third node, and
the second enhancement-mode n-type HEMT comprises a gate coupled to the second node.

9. The circuit of claim 1, wherein
the power supply node is configured to receive a power supply voltage level from a battery.

10. An integrated circuit (IC) comprising: first and second power supply nodes; a power supply reference node; a protection circuit comprising a first output terminal and first and second series of n-type high electron mobility transistors (HEMTs) coupled between the first power supply node and the power supply reference node; a gate driver comprising a second output terminal and third through fifth series of n-type HEMTs coupled between the first power supply node and the power supply reference node; and an n-type HEMT switching device coupled between the second power supply node and the power supply reference node, wherein the first series of n-type HEMTs is configured to control a first voltage on a first node responsive to a first power supply voltage on the first power supply node, the second series of n-type HEMTs is configured to control a second voltage on the first output terminal responsive to the first voltage, the third series of n-type HEMTs is configured to control an internal signal on a second node responsive to the second voltage and to an input signal, the fourth series of n-type HEMTs is configured to control a third voltage on a third node responsive to the internal signal, the fifth series of n-type HEMTs is configured to control an output signal at the second output terminal responsive to the internal signal and the third voltage, and the n-type HEMT switching device is configured to couple a first sub-circuit to one of the second power supply node, the power supply reference node, or a second sub-circuit responsive to the output signal.

11. The IC of claim 10, wherein
the protection circuit further comprises a voltage divider configured to generate a fourth voltage based on the power supply voltage,
the first series of n-type HEMTs comprises a first depletion-mode n-type HEMT coupled between the power supply node and the first node and a first enhancement-mode n-type HEMT coupled between the first node and the power supply reference node,
the second series of n-type HEMTs comprises a second depletion-mode n-type HEMT coupled between the power supply node and the first output terminal and a second enhancement-mode n-type HEMT coupled between the first output terminal and the power supply reference node,
each of the first and second depletion-mode n-type HEMTs is configured as a diode,
the first enhancement-mode n-type HEMT comprises a gate configured to receive the fourth voltage, and
the second enhancement-mode n-type HEMT comprises a gate coupled to the first node.

12. The IC of claim 11, wherein
the voltage divider comprises:
a series of voltage divider components coupled between the power supply node and the power supply reference node; and
a third enhancement-mode n-type HEMT arranged in parallel with a first voltage divider component of the series of voltage divider components,
wherein
   the series of voltage divider components comprises a voltage tap coupled to the gate of the first enhancement-mode n-type HEMT, and
   the third enhancement-mode n-type HEMT comprises a gate coupled to the first node.

13. The IC of claim 10, wherein
the fourth series of n-type HEMTs comprises:
   a first enhancement-mode n-type HEMT, a fourth node, and a depletion-mode n-type HEMT coupled between the power supply node and the third node; and
   a second enhancement-mode n-type HEMT coupled between the third node and the power supply reference node,
each of the first enhancement-mode n-type HEMT and the depletion-mode n-type HEMT is configured as a diode,
the second enhancement-mode n-type HEMT comprises a gate coupled to the third node, and the circuit further comprises a capacitive device coupled between the fourth node and the second output terminal.

14. The IC of claim 10, wherein the n-type HEMT switching device comprises a gate coupled to the second output terminal.

15. The IC of claim 10, wherein
the first sub-circuit comprises some or all of a power or voltage conversion circuit or a power or voltage regulation circuit.

16. The IC of claim 10, wherein the gate driver is positioned between the protection circuit and the n-type HEMT switching device and adjacent to each of the protection circuit and the n-type HEMT switching device.

17. A method of operating a driver circuit, the method comprising:
receiving a first power supply voltage on a first power supply node;
in response to the first power supply voltage, using a first series of n-type high electron mobility transistors (HEMTs) coupled between the power supply node and a power supply reference node to control a first voltage on a first node;
in response to the first voltage, using a second series of n-type HEMTs coupled between the power supply node and the power supply reference node to control a second voltage on a first output terminal;
in response to the second voltage and an input signal, using a third series of n-type HEMTs coupled between the power supply node and the power supply reference node to control an internal signal on a second node;
in response to the internal signal, using a fourth series of n-type HEMTs coupled between the power supply node and the power supply reference node to control a third voltage on a third node; and
in response to the internal signal and the third voltage, using a fifth series of n-type HEMTs coupled between the power supply node and the power supply reference node to control an output signal at a second output terminal.

18. The method of claim 17, wherein
the receiving the first power supply voltage on the first power supply node comprises receiving the first power supply voltage from a battery.

19. The method of claim 17, wherein
the using the fifth series of n-type HEMTs to control the output signal at the second output terminal comprises using a capacitive device coupled between the fourth series of n-type HEMTs and the second output terminal.

20. The method of claim 17, further comprising: in response to the output signal, using an n-type HEMT switching device to couple a first sub-circuit to one of the power supply reference node, a second sub-circuit, or a second power supply node configured to receive a second power supply voltage greater than the first power supply voltage.

* * * * *